United States Patent [19]

Osada et al.

[11] Patent Number: 4,807,036

[45] Date of Patent: Feb. 21, 1989

[54] COMPLEX CIRCUIT COMPONENT FOR A VIDEO SIGNAL CIRCUIT IN A TELEVISION RECEIVER SET

[75] Inventors: Hisashi Osada; Hideaki Fujioka, both of Akita; Ikuo Kato; Yoshinari Yamashita, both of Chiba, all of Japan

[73] Assignee: TDK Corporation, Tokyo, Japan

[21] Appl. No.: 74,003

[22] Filed: Jul. 16, 1987

[30] Foreign Application Priority Data

Jul. 18, 1986 [JP] Japan .............................. 61-110506[U]
Oct. 9, 1986 [JP] Japan .............................. 61-155536[U]

[51] Int. Cl.⁴ ......................... H04N 5/62; H04N 9/64
[52] U.S. Cl. ................................. 358/196; 358/21. R; 333/192; 455/339
[58] Field of Search ..................... 358/196, 21. R, 160, 358/197; 455/339; 333/25, 191, 192, 193, 186, 172

[56] References Cited

U.S. PATENT DOCUMENTS 3,562,417  2/1981  Poppa .................................. 358/196
3,946,338  3/1976  Schmidt .............................. 358/196

Primary Examiner—Tommy P. Chin
Attorney, Agent, or Firm—Martin M. Novack

[57] ABSTRACT

A complex circuit component for a video signal circuit in a television receiver set has a single substrate, on which a first ceramic trap for removing speech carrier wave together with an inductor for that trap, a second trap for removing color subcarrier wave, and a delay circuit coupled with output of said second trap are mounted. The capacitors for those circuits are implemented by a pair of conductive patterns deposited on front surface and rear surface of the substrate. The capacitor for said first ceramic trap is subject to trimming so that the characteristics of the trap is adjustable.

5 Claims, 5 Drawing Sheets

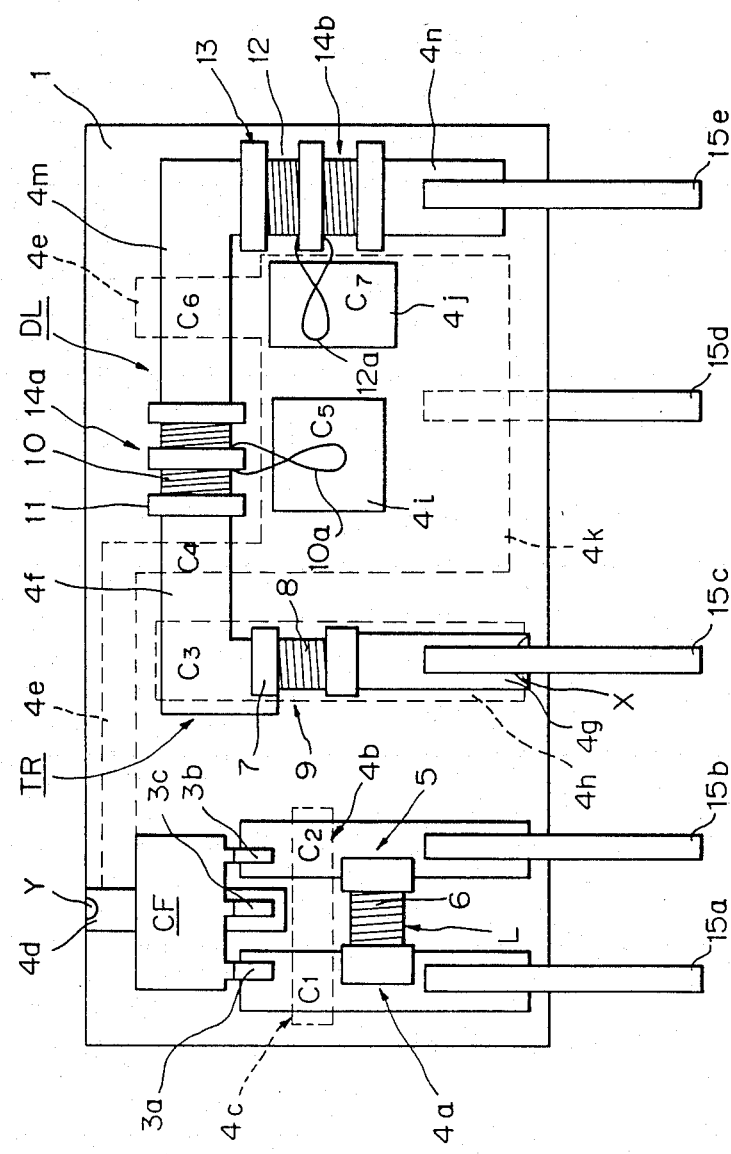

COMPLEX CIRCUIT COMPONENT FOR A VIDEO SIGNAL CIRCUIT IN A TELEVISION RECEIVER SET

BACKGROUND OF THE INVENTION

The present invention relates to a complex circuit component, which has a plurality of electronic components on a single chip. The present invention relates, in particular, to such a component which is used in a video signal process circuit in a television receiver set.

A video signal process circuit in a television receiver set has (a) a three-terminal ceramic trap for removing the speech carrier wave, (b) a coupling inductor in said ceramic trap, (c) a two-terminal trap for removing the color sub-carrier wave, and (d) a three terminal delay circuit for providing time delay to the video signal.

Those four components are conventionally designed separately, and mounted on separate boards. Therefore, the final video signal output of those components is subject to fluctuation by the error of each component, and the resultant picture quality of a television receiver set is not good.

Further, since those components are mounted on separate boards, the total area occupied by those boards is large, and the number of terminals for coupling those boards is large. So, the manufacturing process in handling those boards has been complicated.

SUMMARY OF THE INVENTION

It is an object, therefore, of the present invention to overcome the disadvantages and limitations of a prior video signal circuit by providing a new and improved complex component for a video signal process circuit.

It is also an object of the present invention to provide a complex circuit component which mounts all the related components for a video signal process circuit on a single board.

The above and other objects are attained by a complex circuit component for a video signal circuit having a single substrate, with front conductive patterns and rear conductive patterns deposited on the substrate, a first trap portion having a ceramic trap with a ceramic filter, and an inductor coupled with said ceramic trap, for removing speech carrier wave, mounted on said substrate, a second trap portion having a parallel circuit of an inductor and a capacitor, coupled with output of said first trap portion, for removing color sub-carrier wave, mounted on said substrate, a delay circuit portion coupled with output of said second trap portion, having at least one inductor and at least one capacitor, and lead terminals including an input terminal connected to said first trap portion, an output terminal connected to said delay circuit portion, and a ground terminal for each portions.

BRIEF DESCRIPTION OF THE DRAWINGS

The foregoing and other objects, features, and attendant advantages of the present invention will be appreciated as the same become better understood by means of the following description and accompanying drawings wherein;

FIG. 3 is a plan view of another embodiment of the complex circuit component according to the present invention.

DESCRIPTION OF THE PREFERRED EMBODIMENTS

Figure 1:
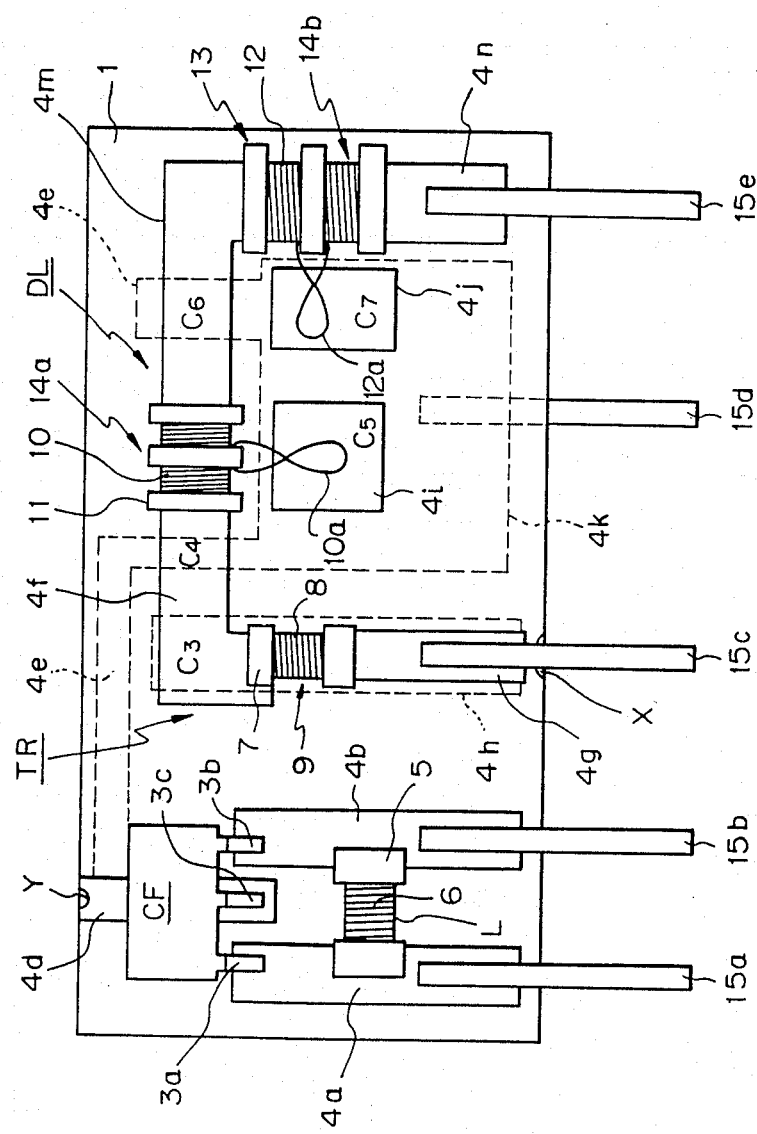
FIG. 1 is a plan view of the complex circuit component according to the present invention.
Figure 2:
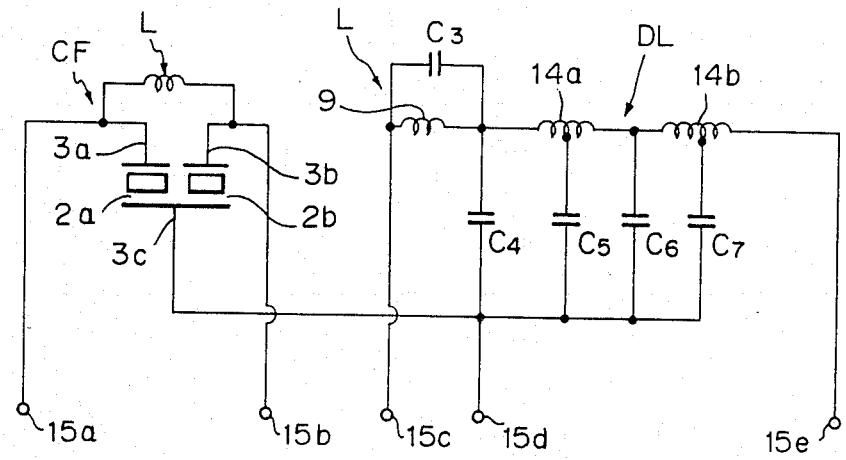
FIG. 2 is an equivalent circuit of the component of FIG. 1.

FIG. 1 shows a plane view of the complex component according to the present invention, and FIG. 2 shows an equivalent circuit of FIG. 1.

The complex component of FIG. 1 has a single dielectric substrate 1 (made of for instance barium titanate), a ceramic trap CF for removing the speech carrier wave, a coupling inductor L for said ceramic trap, another trap TR for removing color sub-carrier wave, a delay circuit DL for delaying video signal, and coupling means for coupling those component elements together and coupling those component elements with an external circuit.

The ceramic trap CF has a pair of ceramic trap elements 2a and 2b (see FIG. 2), an input terminal 3a for providing an input signal to one of the ceramic trap elements, an output terminal 3b for taking an output signal from the other element, and a common ground terminal 3c which is common to both the elements. The ceramic trap CF is mounted on upper left portion of the substrate 1 of FIG. 1.

A pair of parallel linear electrodes 4a and 4b are mounted on the front surface of the substrate 1 with some spacing. The electrodes 3a and 3b of the ceramic trap CF are connected to the electrodes 4a and 4b, respectively. The inductor L which has a cylindrical core 5 and a coil 6 wound on the core 5 is bridged between the electrodes 4a and 4b.

Another trap TR for removing the color sub-carrier wave has an inductor 9 with a cylindrical core 7 and a coil 8 wound on the core 7, a capacitor $C_3$ coupled parallel with said inductor 9, and another capacitor $C_4$ connected in series to said capacitor $C_3$.

On the front surface of the substrate 1, an electrode 4d is provided, which is coupled with the ground terminal 3c of the ceramic trap CF, and extends to the extreme end of the substrate 1. An electrode 4g extending between one end of said inductor 9 and the bottom end (FIG. 1) of the substrate 1, and an L-shaped electrode 4f one end of which is connected to the other end of said inductor 9, are provided on the substrate. On rear surface of the substrate 1, an electrode 4e is provided, one end of which confronts with end of said electrode 4d through the substrate 1, and the other end of said electrode 4e crosses with the electrode 4f through the substrate 1, and an electrode 4h is provided which confronts with a part of said electrode 4f, said inductor 9 and said electrode 4g. The front electrode 4g and the rear electrode 4h are connected to each other at the bottom end X of the substrate 1.

It should be appreciated in the above structure that the capacitance $C_3$ is provided between the electrode 4f and the electrode 4h, and the capacitance $C_4$ is provided between the electrode 4f and the electrode 4e.

The delay circuit DL has an inductor 14a with a magnetic core 11 and a coil wound on the core 11, an inductor 14b with a magnetic core 13 and the coil 12 wound on the core 13, and three capacitors $C_5$, $C_6$ and $C_7$.

Said front electrode 4f is connected to one end of the inductor 14a. A pair of electrodes 4i and 4j are provided on the front surface of the substrate 1 so that those electrodes 4i and 4j are positioned at sides of the inductors 14a, and 14b, respectively. An L-shaped front electrode 4m extends between one end of the inductor 14a and one end of the inductor 14b. And another front electrode 4n is coupled with the other end of the inductor 14b.

On rear surface of the substrate 1, an electrode 4k is provided, which is integral with the electrode 4e, and faces with both said electrodes 4i and 4j, and an electrode 4L is provided which is integral with said electrode 4k and confronts with the front electrode 4m through the substrate 1.

With the above structure, the capacitance $C_5$ is provided between the electrode 4i and the electrode 4k through the substrate, the capacitance $C_6$ is provided between the electrode 4m and the electrode 4L through the substrate 1, and the capacitor $C_7$ is provided between the electrode 4j and the electrode 4k through the substrate 1. The center tap of the inductor 14a is connected to the front electrode 4i, and the center tap 12a of the inductor 14b is connected to the front electrode 4j.

The symbol Y shows the coupling point of the front electrode 4d and the rear electrode 4e.

The complex component has five terminals 15a through 15e for external connection of the present complex component. The terminal 15a is connected to the front electrode 4a, the terminal 15b is connected to the front electrode 4b, the terminal 15c is connected to the electrode 4g, the terminal 15d is connected to the rear electrode 4k, and the terminal 15e is connected to the electrode 4n. The terminal 15d is a common ground terminal which is connected to the ceramic trap CF, the delay circuit DL and the trap TR.

In operation, the terminals 15b and 15c are connected to each other. A color video signal is applied to the terminal 15a, to which the ceramic trap CF is connected, and therefore, speech carrier wave included in the video signal is removed, and the output which has no speech carrier wave is applied to the trap TR through the terminals 15b and 15c. The trap TR removes the color sub-carrier wave. The output of the trap TR is applied to the delay line DL, which has the inductors 14a and 14b, and the capacitors $C_5$, $C_6$ and $C_7$. The delay line DL provides the predetermined time delay to the signal which is free from the speech carrier wave and color sub-carrier wave.

As described above in detail, the present complex circuit component has a single substrate which mounts a ceramic trap CF together with an inductor for said trap CF, a trap TR for removing the color sub-carrier wave, and a delay line DL, together with coupling leads of those components. Therefore, the area for mounting those component elements is considerably reduced as compared with a prior art which mounts each component element on separate substrates.

Further, uniform electrical characteristics are obtained by the present invention, since a plurality of component elements are mounted on a single chip.

Figure 4:
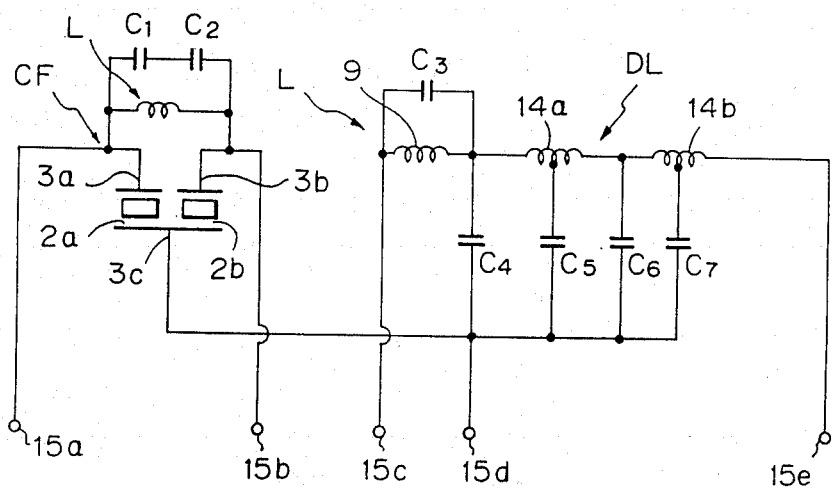
FIG. 4 is an equivalent circuit of the component of FIG. 3.

FIG. 3 shows another embodiment of the present complex circuit component, and FIG. 4 is a circuit of FIG. 3. The same numerals and symbols in FIGS. 3 and 4 as those in FIGS. 1 and 2 shown the same members as those in FIGS. 1 and 2. The feature in the embodiment of FIGS. 3 and 4 is the presence of a rear electrode 4c in the ceramic trap CF. The additional electrode 4c is elongated and bridges the front electrodes 4a and 4b through the substrate 1. The capacitance $C_1$ and the capacitance $C_2$ are obtained between the front electrode 4a and the rear electrode 4c, and between the front electrode 4b and the rear electrode 4c, respectively. Those capacitors $C_1$ and $C_2$, are essentially, connected in series with each other, and in parallel to the inductor L. It should be appreciated that the capacitance of the capacitors $C_1$ and $C_2$ is adjustable by trimming the area of the electrode 4c by using a laser beam so that the characteristics of the ceramic trap are controlled.

Figure 5:
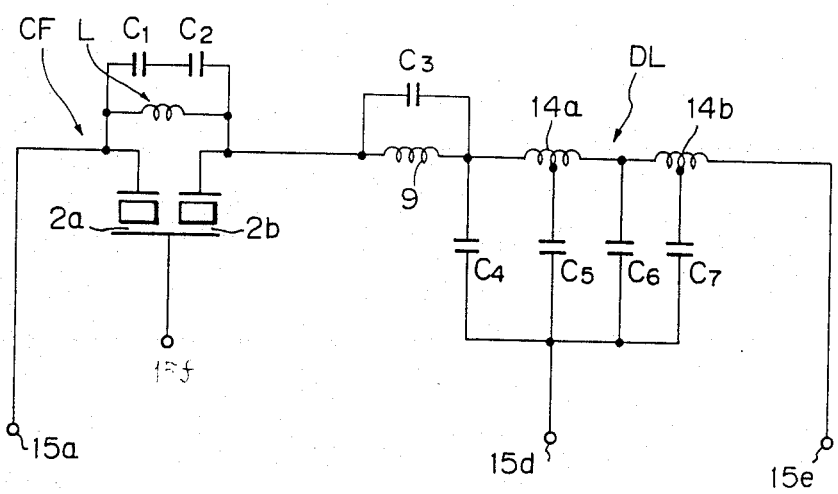
FIG. 5 is an equivalent circuit of the modification of the present invention.

FIG. 5 shows the modification of the circuit of FIG. 4. The features of FIG. 5 are that the terminals 15b and 15c are omitted, and those terminals are connected together within the substrate, and the common ground terminal 15d of FIG. 4 is separated to the common ground terminal 15d (FIG. 5), and the ground terminal 15f of the ceramic trap CF. The modification of FIG. 5 is advantageous since it has less external terminals than that of FIG. 4.

Figure 6:
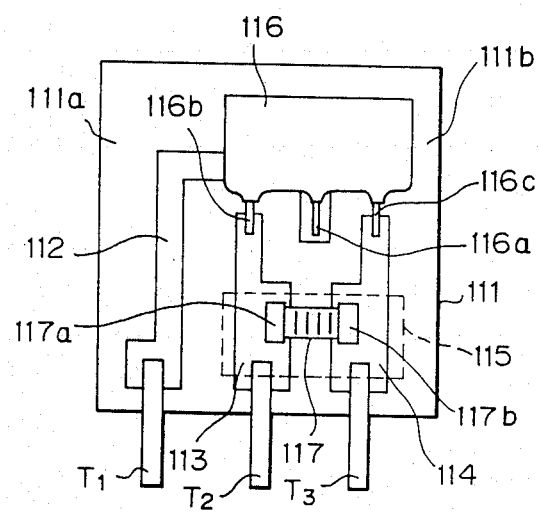
FIGS. 6(a) and 6(b) are modifications of the complex circuit component according to the present invention.
Figure 6B:
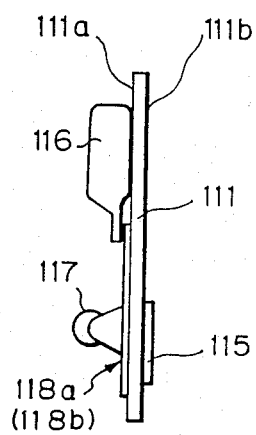

FIG. 6a shows the modification of the embodiment of FIG. 3, and FIG. 6b is the side view of FIG. 6a. That modification of FIGS. 6a and 6b has only a ceramic trap portion CF for removing the speech carrier wave, together with a trimming capacitor.

The numeral 111 is a substrate made of Barium titanate. On front surface 111a of the substrate 111, three separate electrodes 112, 113 and 114 are provided, and on rear surface 111b of the substrate there is provided another electrode 115 which faces with the front electrodes 113 and 114 through the substrate. Those electrodes are deposited on surfaces of the substrate through conventional screen print method, sputtering method, and/or etching method. A three terminals trap element 116 is connected to the electrodes 112, 113 and 114 at the points 116a, 116b and 116c, respectively, through a soldering process. The inductance element 117 is connected between the electrodes 113 and 114 through a soldering process. The capacitance 118a (118b) is provided between the front electrode 113 (114) and the rear electrode 115 through the substrate. That capacitance is adjustable by trimming the area of the rear electrode 115 by using laser beam.

Figure 7:
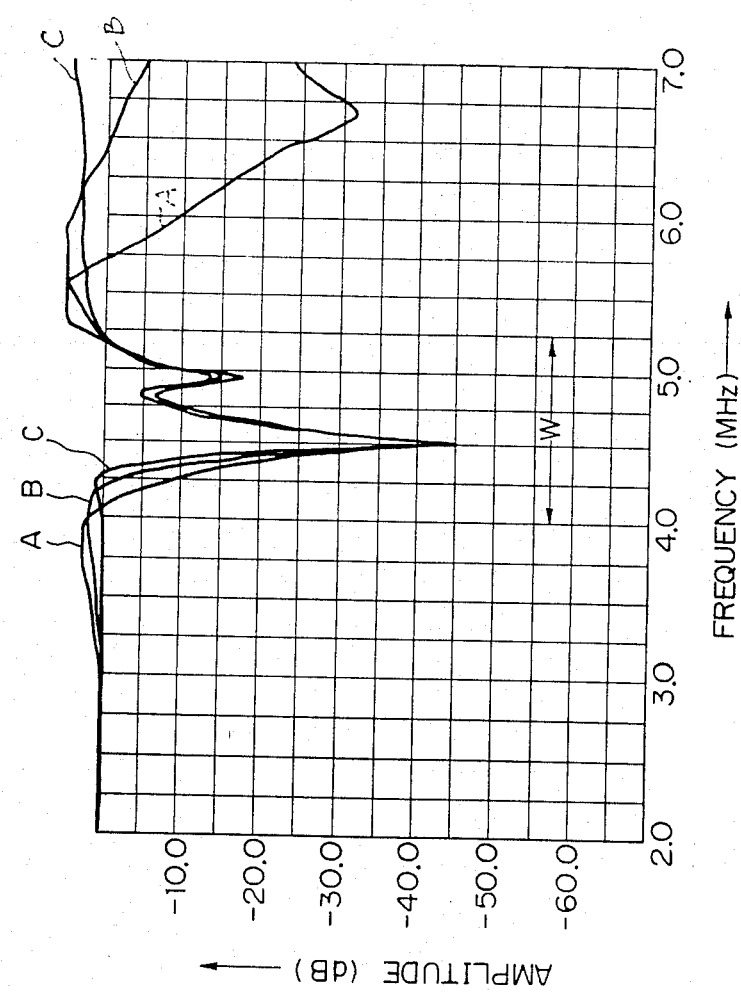
FIG. 7 shows the experimental curves of the component of FIGS. 6(a) and 6(b).

FIG. 7 shows the experimental curves of the ceramic trap of FIGS. 6a and 6b. In FIG. 7, the horizontal axis shows frequency in MHz, and the vertical axis shows the amplitude of signal in dB. The input signal is applied to the terminals $T_1$ and $T_2$ in FIG. 6a, and the output signal which is free from the speech carrier wave is provided to the terminals $T_1$ and $T_3$. The curves A, B and C in FIG. 7 show the characteristics of the ceramic trap depending upon the area of the rear electrode 115. As apparent in FIG. 7, the characteristics of the ceramic filter for removing speech carrier wave of 4.5 MHz is adjusted depending upon the area of the trimming electrode 115. So, the trimming of the electrode 115 provides the desired characteristics of a ceramic trap, irrespective of manufacturing errors of component elements.

From the foregoing it will now be apparent that a new and improved complex circuit component has been found. It should be understood by course that the embodiments disclosed are merely illustrative and are not intended to limit the scope of the invention. Reference should be made to the appended claims, therefore, rather than the specification as indicating the scope of the invention.

What is claimed is;

1. A complex circuit component for a video signal in a color television receiver set comprising;
    a single substrate, with front conductive patterns and rear conductive patterns deposited on the substrate,
    a first trap portion for receiving said video signal and having a ceramic trap with a ceramic filter, and an inductor coupled with said ceramic trap, for removing speech carrier wave, mounted on said substrate,
    a second trap portion having a parallel circuit of an inductor and a capacitor, coupled with an output of said first trap portion, for removing color subcarrier wave, mounted on said substrate,
    a delay circuit portion coupled with an output of said second trap portion, having at least one inductor and at least one capacitor, and
    lead terminals including an input terminal connected to said first trap portion, and output terminal connected to said delay circuit portion and a ground terminal for each of said portions.

2. A complex circuit component according to claim 1, wherein said capacitors are implemented by capacitance between a front conductive pattern and a rear conductive pattern facing to said front conductive pattern through the substrate.

3. A complex circuit component according to claim 1, wherein a common lead terminal is provided for the ground terminal of said first trap portion and the ground terminal of said delay circuit portion.

4. A complex circuit component according to claim 1, wherein an additional rear conductive pattern facing with a pair of front conductive patterns which are bridged by said inductor in said first trap portion is provided, and said additional rear conductive pattern is subject to trimming for adjusting capacitance coupled with said inductor in said first trap portion.

5. A complex circuit component for video signal circuit in a color television receiver set comprising;
    a single substrate,
    a first, a second and a third conductive patterns deposited on front surface of said substrate,
    a ceramic trap with a ceramic filter coupled with said three conductive patterns,
    an inductor coupled between said second conductive pattern and said third conductive pattern, and
    a fourth conductive pattern deposited on rear surface of said substrate so that said fourth conductive pattern faces with a part of said second conductive pattern and a part of said third conductive pattern through the substrate, and said fourth conductive pattern is subject to trimming.

* * * * *